(12) United States Patent
Zweers et al.

(10) Patent No.: US 12,439,509 B2
(45) Date of Patent: Oct. 7, 2025

(54) EDGE ENABLED VOID CONSTRUCTIONS

(71) Applicant: Qorvo US, Inc., Greensboro, NC (US)

(72) Inventors: Jan-Willem Zweers, Nieuwleusen (NL); Richard Perkins, Encinitas, CA (US); Bror Peterson, Fairview, TX (US)

(73) Assignee: Qorvo US, Inc., Greensboro, NC (US)

( * ) Notice: Subject to any disclaimer, the term of this patent is extended or adjusted under 35 U.S.C. 154(b) by 233 days.

(21) Appl. No.: 18/190,462

(22) Filed: Mar. 27, 2023

(65) Prior Publication Data

US 2023/0319982 A1   Oct. 5, 2023

Related U.S. Application Data

(60) Provisional application No. 63/327,376, filed on Apr. 5, 2022.

(51) Int. Cl.
*H05K 1/02* (2006.01)

(52) U.S. Cl.
CPC . *H05K 1/0243* (2013.01); *H05K 2201/10053* (2013.01); *H05K 2201/10098* (2013.01)

(58) Field of Classification Search
CPC ....... H05K 1/0243; H05K 2201/10053; H05K 2201/10098
USPC ...................................................... 361/748
See application file for complete search history.

(56) References Cited

U.S. PATENT DOCUMENTS

| | | | | |
|---|---|---|---|---|
| 10,381,721 | B2* | 8/2019 | Wang | H01Q 5/321 |
| 11,901,641 | B2* | 2/2024 | Vazquez | H01Q 9/42 |
| 2003/0193437 | A1 | 10/2003 | Kangasvieri et al. | |
| 2010/0238079 | A1 | 9/2010 | Ayatollahi et al. | |
| 2012/0274522 | A1 | 11/2012 | Ayatollahi | |
| 2016/0064820 | A1* | 3/2016 | Kim | H01Q 1/243 |
| | | | | 343/767 |
| 2020/0112089 | A1 | 4/2020 | Zweers | |

FOREIGN PATENT DOCUMENTS

EP   2830153 A1   1/2015

OTHER PUBLICATIONS

Johanson Technology, "Johanson Technology's 7-band, single Antenna Solution for: Cellular LTE NB IoT/CAT M1, Sub GHz, GPS/GNSS, and 2.4GHz," available as early as Apr. 2022 from the Internet: [URL: https://www.johansontechnology.com/iot-multiband-antenna-solution], 6 pages.
Extended European Search Report for European Patent Application No. 23166629.8, mailed Aug. 11, 2023, 9 pages.

\* cited by examiner

*Primary Examiner* — Binh B Tran
(74) *Attorney, Agent, or Firm* — Withrow & Terranova, P.L.L.C.

(57) ABSTRACT

In some embodiments, a printed circuit board is disclosed. The printed circuit board includes a substrate, a conductive plane, and at least one switch. The conductive plane includes an edge enabled void construction (EEVC) along a geometric perimeter of the conductive plane, the EEVC having an EEVC void that defines an EEVC perimeter that extends into the conductive plane.

12 Claims, 10 Drawing Sheets

EDGE ENABLED VOID CONSTRUCTIONS

RELATED APPLICATIONS

This application claims the benefit of U.S. provisional patent application Ser. No. 63/327,376, filed on Apr. 5, 2022, the disclosure of which is incorporated herein by reference in its entirety.

FIELD OF THE DISCLOSURE

The technology of the disclosure relates generally to a radio frequency (RF) antenna.

BACKGROUND

Wireless devices have become increasingly common in current society. The prevalence of these wireless devices is driven in part by the many functions that are now enabled on such devices. Increased processing capabilities in such devices means that wireless devices have evolved from being pure communication tools into sophisticated multimedia centers that can interact with a variety of connected devices in such wireless environments as the Internet-of-Things (IoT).

As capabilities of the wireless devices increase, so does the number of active and/or passive components in the wireless devices. Contrary to increased component count and integration complexity, form factor of the wireless devices has become more and more compact. As a result, real estate inside the form factor becomes increasingly scarce.

A wireless device may include a number of antennas to provide receive diversity and/or enable such advanced transmit mechanisms as multiple-input, multiple-output (MIMO) and beamforming. Notably, an antenna typically requires sufficient spatial separation from other active/passive components in the wireless device so as to effectively radiate an electromagnetic wave(s). As such, it may be desirable to provide as many antennas as needed in the wireless device, without having to increase footprint of the wireless device.

SUMMARY

In some embodiments, a printed circuit board is disclosed. The printed circuit board includes a substrate, a conductive plane, and at least one switch. The conductive plane includes an edge enabled void construction (EEVC) along a geometric perimeter of the conductive plane, the EEVC having an EEVC void that defines an EEVC perimeter that extends into the conductive plane. In some embodiments, the EEVC is an edge enable void antenna (EEVA). In some embodiments, the EEVC is an edge enable void isolator (EEVI). The switch having a first switch port and a second switch port such that the switch is operable to be in a conducting state and a nonconducting state with respect to the first switch port and the second switch port. The first switch port being coupled to a first location of the EEVC perimeter and the second switch port is coupled to a second location of the EEVC perimeter. In some embodiments, a portion of the substrate fills the EEVC void. In some embodiments, a conductive plane is a ground plate for the printed circuit board. In some embodiments, the printed circuit board includes a ground plate for the printed circuit board, wherein the ground plate defines a ground plate void and the conductive plane is inserted into the ground plate void. In some embodiments, the EEVC void defines a meandering path such that the EEVC perimeter defines a first edge and a second edge such that the first edge faces the second edge, wherein the first location is on the first edge and the second location is on the second edge. In some embodiments, the printed circuit board of claim 1, further includes: an EEVC perimeter defining an exterior edge such that the exterior edge defines a first side and a second side, wherein the first side faces the second side; a conductive island provided between the first side and the second side of the exterior edge such that an island perimeter of the conductive island is part of the EEVC perimeter; wherein the first location is on the first side of the exterior edge and the second location is on the island perimeter. In some embodiments, the printed circuit board further includes a second switch, wherein: the switch is a first switch; the island perimeter defines a first island side and a second island side: the first location is at the first island side; the second switch having a third switch port and a fourth switch port such that the second switch is operable to be in the conducting state and the nonconducting state with respect to the third switch port and the fourth switch port; the third switch port is coupled to the second island side and the fourth switch port is connected to the second side of the exterior edge. In some embodiments, the printed circuit board further includes a second conductive island, wherein: the conductive island is a first conductive island; the second conductive island is provided between the first side and the second side of the exterior edge such that an island perimeter of the second conductive island is part of the EEVC perimeter; the third switch port is coupled to the island perimeter of the second conductive island and the fourth switch port is connected to the second side of the exterior edge.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE FIGURES

The accompanying drawing figures incorporated in and forming a part of this specification illustrate several aspects of the disclosure, and together with the description serve to explain the principles of the disclosure.

DETAILED DESCRIPTION

Figure 1:
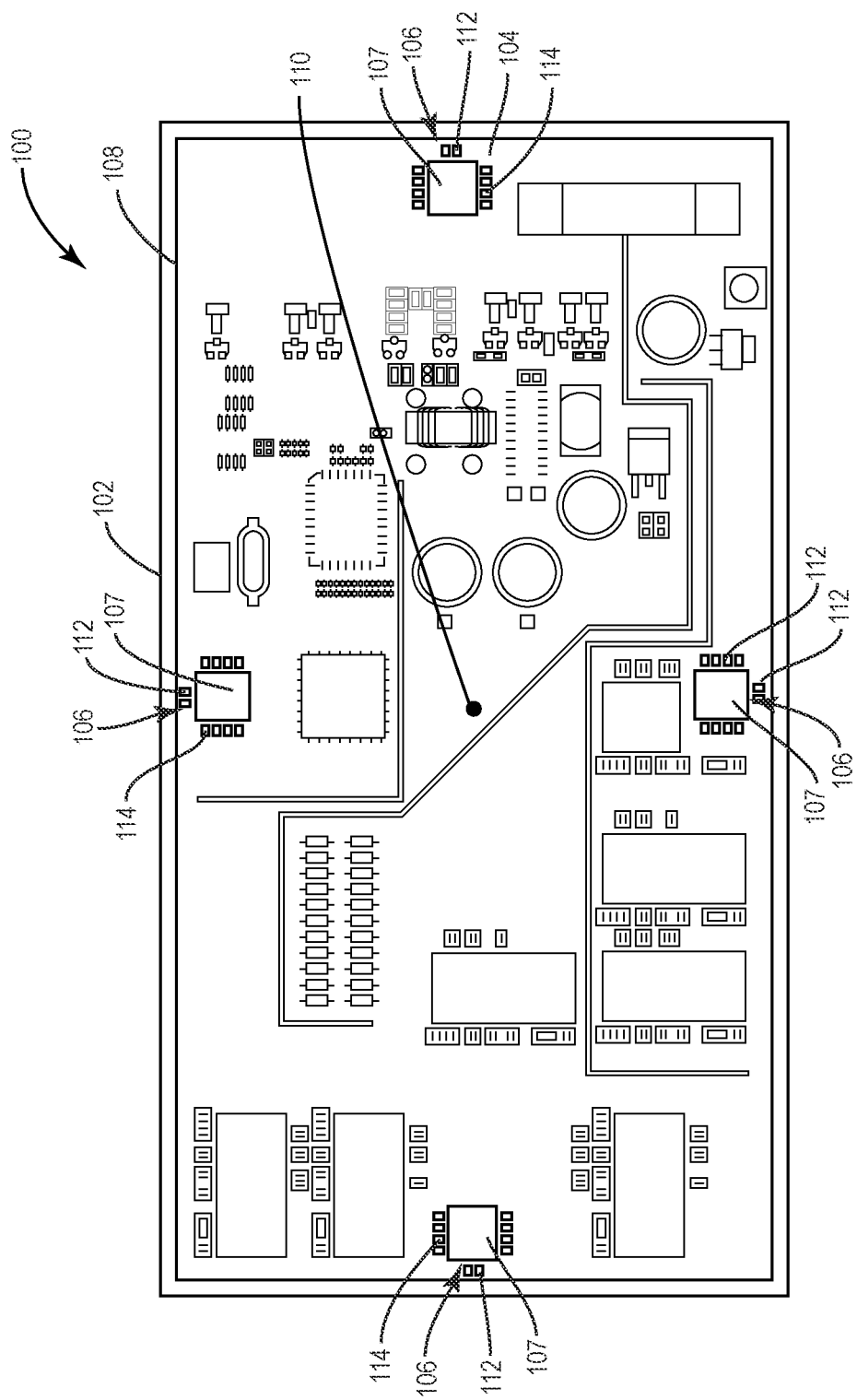
FIG. 1 is a printed circuit board, in accordance with some embodiments.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Embodiments of an edge enable void construction (EEVC) are disclosed. In some embodiments the EEVC is an edge enable void antenna (EEVA). In some embodiments, the EEVC is an edge enable void isolator (EEVI). The EEVC defines an EEVC void on a conductive plane. The EEVC void may have different shapes such as rectangular, a meandering path, or a series of islands surrounded by an exterior edge. Switches are places along the EEVC void. By selecting the switches, different portions of the EEVC void are shorted, thereby allowing for the inductance of the EEVC to be changed and thus the frequency band in which the EEVC is operating.

FIG. 1 is a printed circuit board 100, in accordance with some embodiments.

The printed circuit board 100 is utilized to mount and distribute signals between various electronic components. Examples of electronic components that may be mounted on the printed circuit board include microprocessors, transceiver circuitry, digital processing circuitry, analog circuitry, front end circuitry, digital signal processors, filters, amplifiers, power regulation circuitry, and/or the like. These electronic components are provided as integrated circuits formed on semiconductors packed in electronic circuit packages, in accordance with some embodiments. The printed circuit board 100 includes a substrate 102, wherein the substrate 102 forms the body of the printed circuit board 100. In some embodiments, the substrate 102 is formed from an epoxy laminate sheet, glass, fiberglass, Teflon, metal, and any other acceptable material used to provide Surface Mount Technology (SMT). In some embodiments, a conductive structure is formed within the substrate 102 in order to form connections between the electronic components mounted on the printed circuit board 100.

A conductive plane 104 is mounted on the substrate 102. For example, in some embodiments, the conductive plane 104 is a ground plate used to provide a ground voltage for some or all of the electronic components mounted on the printed circuit board 100. Various EEVC apparatuses are formed within the conductive plane 104.

In this regard, FIG. 1 is a schematic diagram of an exemplary edge enable void radiator (EEVC) 106 configured according to an embodiment of the present disclosure. In some embodiments, one or more of EEVC apparatuses 106 are edge enabled void antennas (EEVAs). In some embodiments, one or more of the EEVC apparatus 106 are edge enabled void isolators (EEVIs). The EEVC apparatus 106 are formed by a void using the conductive plane 104. The void has a defined geometric shape (e.g., polygonal-shaped, elliptical-shaped, meandering path, isolated island, etc.) and a defined thickness (e.g., thirty-three (33) micrometers or less).

In some embodiments, the void is formed in the conductive plane 104 (e.g., the ground plane) itself, as explained in further detail below. In other embodiments, a void is formed in the conductive plane 104 and a module is inserted into the void of the conductive plane 104, as explained in further detail below. The module then includes a conductive plane (explained in further detail below) and a EEVC void 107 for the EEVC 106 is formed by the conductive plane of the module. In some embodiments, the EEVC void 107 for the EEVC 106 is filled with the substrate 102.

Each EEVC 106 includes the EEVC void 107. Due to the skin effect of a conductive plane, current flows a geometric perimeter of the conductive plane with the EEVC void 107. The conductive plane 104 has a geometric perimeter 108 and a geometric center 110. Hereinafter, the geometric perimeter 108 refers to the continuous line forming a boundary of the conductive plane 104. For example, the geometric perimeter 108 can refer to the four edges of a rectangular-shaped conductive plane or the circle defining the circumference of a circular-shaped conductive plane.

According to an embodiment of the present disclosure, the EEVCs 106 can be formed in the conductive plane 104 by creating the EEVC void 107 on the conductive plane 104 or on a conductive plane inserted in the conductive plane 104. The EEVC void 107 extends from the geometric perimeter 108 toward the geometric center 110 of the conductive plane 104. The EEVC void 107 can be in any geometric shape.

When the EEVC 106 is an EEVA, the EEVC apparatus 106 includes an RF port 112 the geometric perimeter with the EEVC void 107. When the EEVC 106 is an EEVI, the geometric perimeter with the EEVC void 107 is not connected to an RF port 112.

For an EEVA, the RF port 112 is configured to receive an outgoing RF signal. The outgoing RF signal corresponds to a defined bandwidth of wavelength that is proportionally related to velocity and inversely related to frequency of the outgoing RF signal. For example, if the velocity of the outgoing RF signal in free space is $3 \times 10^8$ meters/second and the frequency of the outgoing RF signal is 2.4 GHz, the defined bandwidth of wavelength of the outgoing RF signal in free space is approximately 122 millimeters.

The RF port 112 may be coupled to a transceiver circuit via a conductive trace to receive the outgoing RF signal. The outgoing RF signal excites the conductive plane 104 to induce an electrical current. An electrical current 38 may be induced along the geometric perimeter 108 of the conductive plane 104 and the defined perimeter of the EEVC void 107. The electrical current generates a respective electric field (E-field) and a respective magnetic field (H-field). Notably, the H-field can cause RF energy being radiated into a correlated reflecting direction. As such, the EEVC void 107 created at the geometric perimeter 108 of the conductive plane 104 can cause a phase change of the electrical current around the defined perimeter of the EEVC void 107, thus creating a voltage potential at the EEVC void 107. When impedance of the EEVC matches impedance of the transceiver circuit, an outgoing electromagnetic wave, which corresponds to the outgoing RF signal, can be radiated very efficiently from the EEVC.

By forming the EEVC 106, it may be possible to enable a well-functioning antenna apparatus with a very small effective footprint. As illustrated later, it may be possible to form multiple EEVCs 106 with the conductive plane 104, thus allowing antennas to be provided in a small form factor wireless device (e.g., a handheld remote control, a smartphone, a wearable device, etc.) without increasing the footprint of the wireless device.

The printed circuit board 100 may include EEVC tuning circuitry coupled in parallel to the EEVC void 107. In a non-limiting example, the EEVC tuning circuitry includes a capacitor (as, which can be a voltage-controlled capacitor, a programmable capacitor matrix, an electronically controlled capacitor, a fixed value capacitor, or a microstrip capacitor, for example). Notably, the EEVC tuning circuitry may also be configured to include an inductor, as opposed to the capacitor. The EEVC tuning circuitry may be controlled, for example, by the transceiver circuit, to cause the EEVC to resonate at a primary resonate frequency. As further discussed later, the primary resonate frequency can be used as one of the tuning parameters for configuring the EEVC apparatus 106 to provide a dipole antenna(s) or to support such functionality as RF beamforming.

With reference back to FIG. 1, the EEVCs 106 can be further configured to absorb an incoming electromagnetic wave corresponding to an incoming RF signal. In a non-limiting example, the incoming RF signal can be provided from the RF port 112 to the transceiver circuit via the conductive trace.

In other embodiments, the RF port 112 is not connected to the EEVC void 107 and one or more of the EEVCs 106 are provided as an EEVI. The EEVI is configured to block an electric signal and often is utilized to block frequency bands from an antenna including EEVAs.

The EEVC void 107 has an effective length, which determines the frequency band that the EEVC 106 is tuned to. Switches 114 (not all labeled for the sake of clarity) are connected along the EEVC void 107. Each of the switches 114 has at least a pair of switch ports. Each of the switches 114 is configured to be in a conducting state and in a nonconducting state with respect to the pair of switch ports. For each of the EEVCs 106, the switches 114 have one of the switch ports connected at one location of the EEVC perimeter and the other switch port connected to a different location of the EEVC perimeter. In this manner, by selecting the switch 114, the effective length of the current path provided by EEVC void 107 can be selected. This allows for the tuning to different frequency bands.

Figure 2:
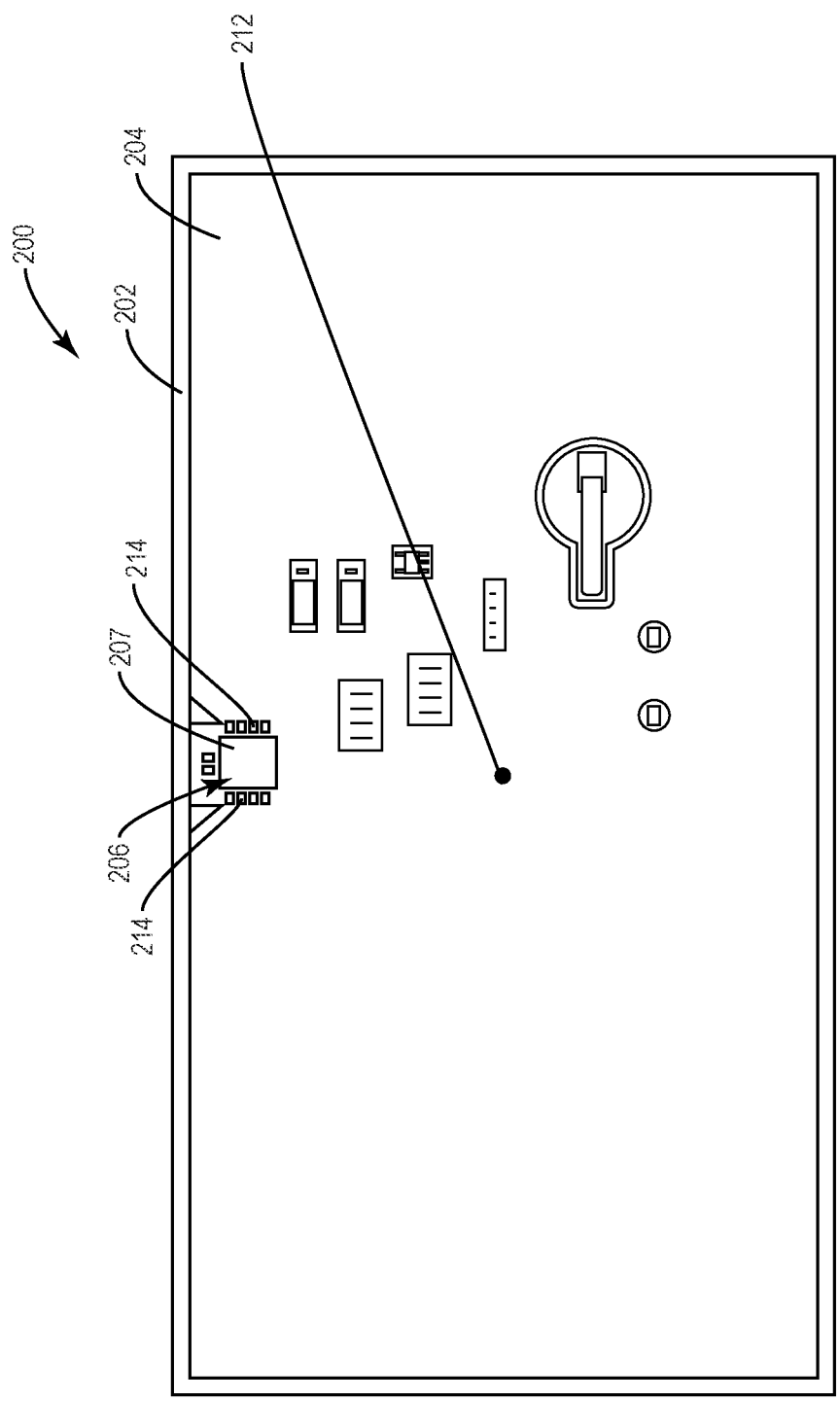
FIG. 2 is a printed circuit board, in accordance with some embodiments.

FIG. 2 is a printed circuit board 200, in accordance with some embodiments.

The printed circuit board 200 includes a substrate 202 and a conductive plane 204 formed on a surface of the substrate 202. The printed circuit board 200 is an embodiment of the printed circuit board 100 shown in FIG. 1. The substrate 202 is an embodiment of the substrate 102 formed in FIG. 1. The conductive plane 204 is an embodiment of the conductive plane 104 shown in FIG. 1.

An EEVC 206 is formed by the conductive plane 204. In this embodiment, the conductive plane 204 is a ground plate. The conductive plane 204 defines an EEVC void 207, which in this embodiment is a ground plate void. A geometric perimeter 210 of the conductive plane 204 includes the EEVC void 207. The EEVC void 207 extends towards a geometric center 212 of the conductive plane 204. In some embodiments, the EEVC 206 is an EEVA. In some embodiments, the EEVC 206 is an EEVI. The EEVC perimeter of the EEVC void 207 extends toward the geometric center 212 from the geometric perimeter 210. In this embodiment, the EEVC 206 is formed by the conductive plane 204 (e.g., the ground plate) itself.

The EEVC void 207 has an effective length, which determines the frequency band that the EEVC 206 is tuned to. Switches 214 (not all labeled for the sake of clarity) are connected along the EEVC void 207. Each of the switches 214 has at least a pair of switch ports. Each of the switches 214 is configured to be in a conducting state and in a nonconducting state with respect to the pair of switch ports. For the EEVCs 206, the switches 214 have one of the switch ports connected at one location of the EEVC perimeter and the other switch port connected to a different location of the EEVC perimeter. In this manner, by selecting the switch 214, the effective length of the current path provided by the EEVC void 207 can be selected. This allows for the tuning to different frequency bands.

Figure 3B:
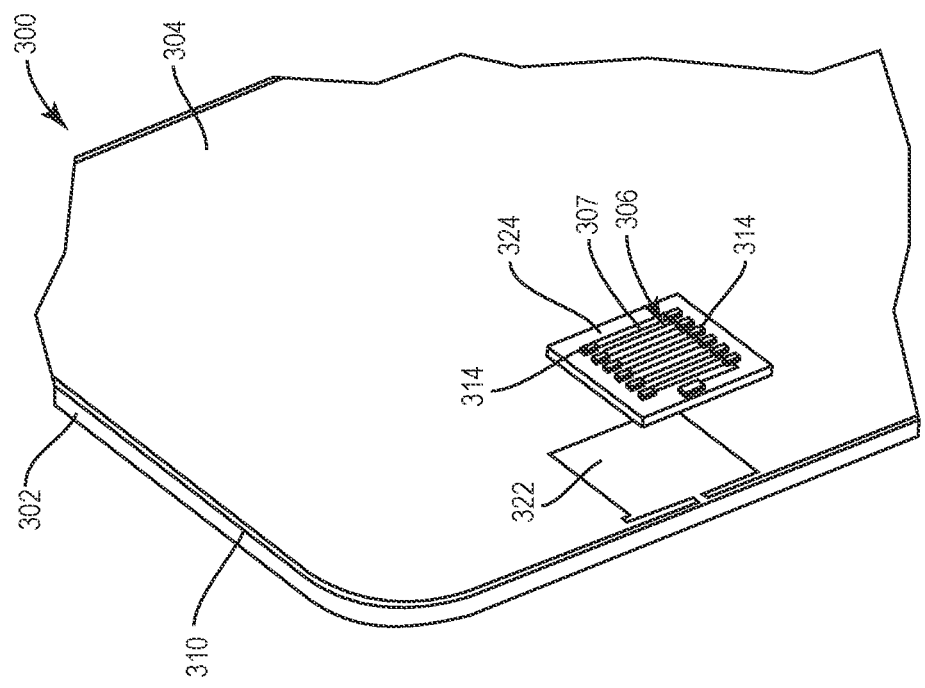
FIG. 3A and FIG. 3B illustrate a printed circuit board, in accordance with some embodiments.
Figure 3A:
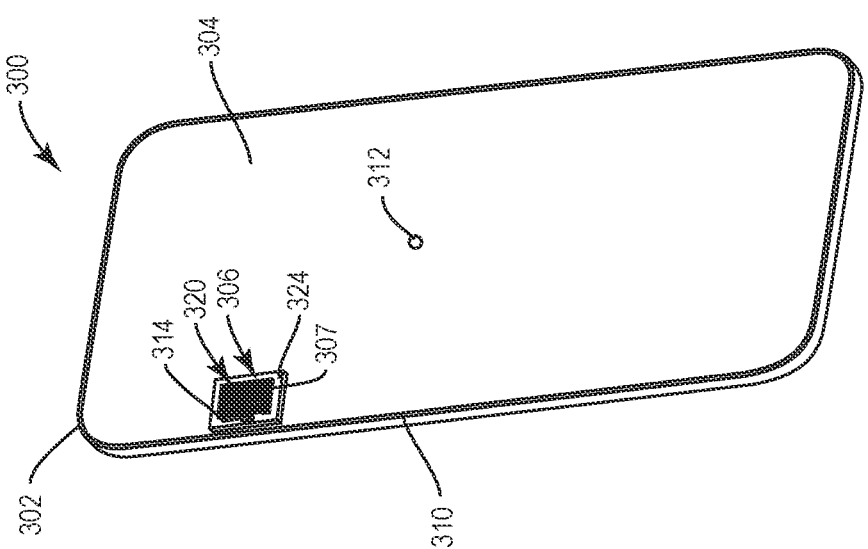

FIG. 3A and FIG. 3B illustrate a printed circuit board 300, in accordance with some embodiments.

The printed circuit board 300 includes a substrate 302 and a conductive plane 304 formed on a surface of the substrate 302. The printed circuit board 300 is an embodiment of the printed circuit board 100 shown in FIG. 1. The substrate 302 is an embodiment of the substrate 102 formed in FIG. 1. The conductive plane 304 is an embodiment of the conductive plane 104 shown in FIG. 1.

An EEVC 306 is formed in a module 320. A void 322 is formed in the conductive plane 304, wherein the module 320 is inserted so as to fill the void 302. The void 322 is formed along a geometric perimeter 310 of the conductive plane 304. In this embodiment, the conductive plane 304 is a ground plate.

In some embodiments, the module 320 is made from a metallic material so as to form a conductive plane 324. In other embodiments, the module 320 includes a substrate (not shown) where the conductive plane 324 is formed on the substrate. The conductive plane 324 defines an EEVC void 307, which in this embodiment is a module void. The geometric perimeter 310 of the conductive plane 324 includes the EEVC void 307. When the module 320 is inserted into the void 322, the EEVC void 307 extends towards a geometric center 312 of the conductive plane 304. The void 307 is formed at or near the geometric perimeter 310 of the conductive plane 324. In some embodiments, the EEVC 306 is an EEVA. In some embodiments, the EEVC 306 is an EEVI.

The EEVC void 307 has an effective length, which determines the frequency band that the EEVC 306 is tuned to. Switches 314 (not all labeled for the sake of clarity) are connected along the EEVC void 307. Each of the switches 314 has at least a pair of switch ports. Each of the switches 314 is configured to be in a conducting state and in a nonconducting state with respect to the pair of switch ports. For the EEVCs 306, the switches 314 have one of the switch ports connected at one location of the EEVC perimeter and the other switch port connected to a different location of the EEVC perimeter. In this manner, by selecting the switch 314, the effective length of the current path provided by EEVC void 307 can be selected. This allows for the tuning to different frequency bands.

Figure 4:
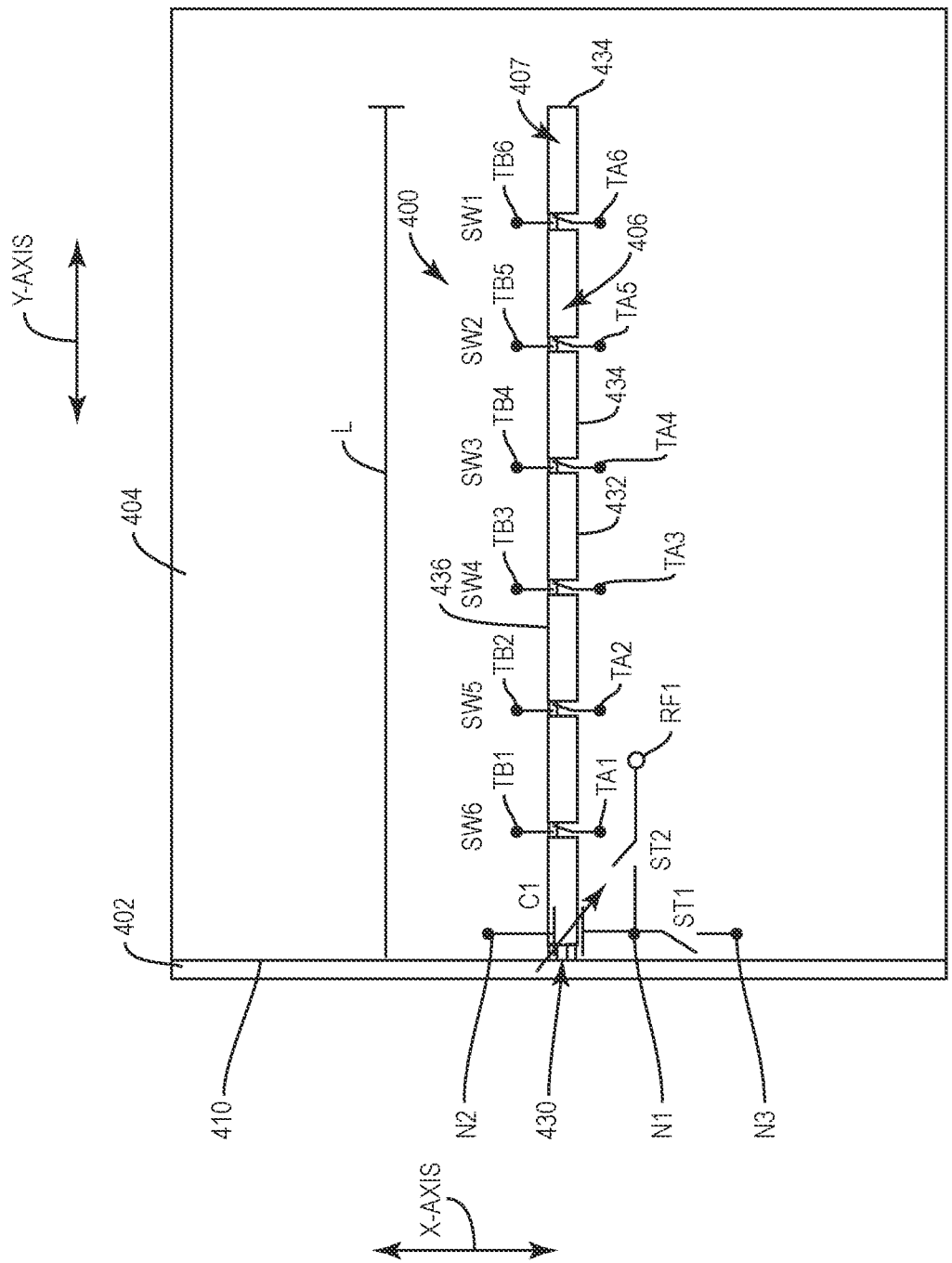
FIG. 4 illustrates an edge enable void construction (EEVC), in accordance with some embodiments.

FIG. 4 illustrates an EEVC 400, in accordance with some embodiments.

In some embodiments, one or more of the EEVCs 106 in FIG. 1 are provided as the EEVC 400 in FIG. 4. In some embodiments, the EEVC 206 is provided as the EEVC 400 in FIG. 4. In some embodiments, the EEVC 306 in FIG. 3A and FIG. 3B is provided in accordance with the EEVC 400 in FIG. 4. In some embodiments, the EEVC 400 is an EEVA. In some embodiments, the EEVC 400 is an EEVI.

The EEVC 400 is formed on a conductive plane 404. In some embodiments, the conductive plane 404 is the conductive plane 204 in FIG. 2. In some embodiments, the conductive plane 404 is the conductive plane 324 of FIG. 3A and FIG. 3B.

The EEVC 400 is formed by an EEVC void 407 formed in the conductive plane 404. The EEVC void 407 is filled by a substrate 402, in accordance with some embodiments. In some embodiments, the substrate 402 is the substrate 202 of FIG. 2 or the substrate 302 of FIG. 3A and FIG. 3B. An X-axis is defined at the EEVC void 407 along a geometric perimeter 410 of the conductive plane. A Y-axis is defined as aligned with the conductive plane 404 and orthogonal to the X-axis. An opening 430 of the EEVC void 407 is aligned with the geometric perimeter 410 that extends parallel to the X-axis.

An edge 432 along an EEVC perimeter 434 extends along the Y-axis. Another edge 436 along the EEVC perimeter 434 extends along the Y-axis. The edge 432 and the edge 436 face one another and are oppositely disposed with respect to the X-axis. Another edge 438 along the EEVC perimeter 434 extends along the X-axis and connects the edge 432 to the edge 436. The edge 438 is opposite the opening 430 with respect to the Y-axis. In this embodiment, the edge 432 has the same length L as the edge 436. Thus, in this embodiment the EEVC void 407 is rectangular.

Switches SW1-SW6 (referred to collectively and/or generically as switches SW) are provided along the EEVC perimeter 434. Each of the switches SW1-SW6 has a terminal TA1-TA6 (referred to collectively and/or generically as terminal TA) along different locations of the edge 432. Each of the switches SW1-SW6 has a terminal TB1-TB6 (referred to collectively and/or generically as terminal TB) along different locations of the edge 436. With respect to the Y-axis, the location of the terminal TA of each switch SW on the edge 432 is aligned is aligned with the location of the terminal TB of the respective switch SW. Accordingly, if none of the switches SW are selected to be in the conducting state, then the length of the current path created by the EEVC 400 with respect to the Y-axis is L. However, if one of the switches SW is selected to be in the conducting state while the other switches SW are in the non-conducting state, then the dipole created by the EEVC 400 has a length that is some proportion of the length L (that is less than 1) with respect to the Y-axis. Thus, by selecting one of the switches SW, the effective length of the current path of the EEVC 400 is selected.

At the opening 430, a first node N1 is connected to the edge 432 and a node N2 is connected to the edge 436. The variable capacitive device C1 is connected between the node N1 and the node N2. In this manner, the variable capacitive device C1 is connected in parallel with the EEVC 400. By varying a variable capacitance of the variable capacitive device C1, a frequency band of the EEVC 400 can be tuned. A switch ST1 is connected between the a node N3 and the node N1. The node N3 is connected to the geometric perimeter 410 on the side of the edge 432. A switch ST2 is connected between the node N1 and an RF port RF1. By providing the switch ST1 is an conducting state and the switch ST2 is a non-conducting state, the RF port RF1 is blocked and the EEVC 400 operates as an EEVI. By providing the switch ST1 is a nonconducting state and the switch ST2 is a conducting state, a path to the RF port RF1 is closed and the EEVC 400 operates as an EEVA.

The advantage of the EEVC 400 is its simplicity as it has a simple rectangular EEVC void 407. However, the length L of the EEVC void 407 can become impractical or impossible for some RF frequency band in some embodiments.

Figure 5:
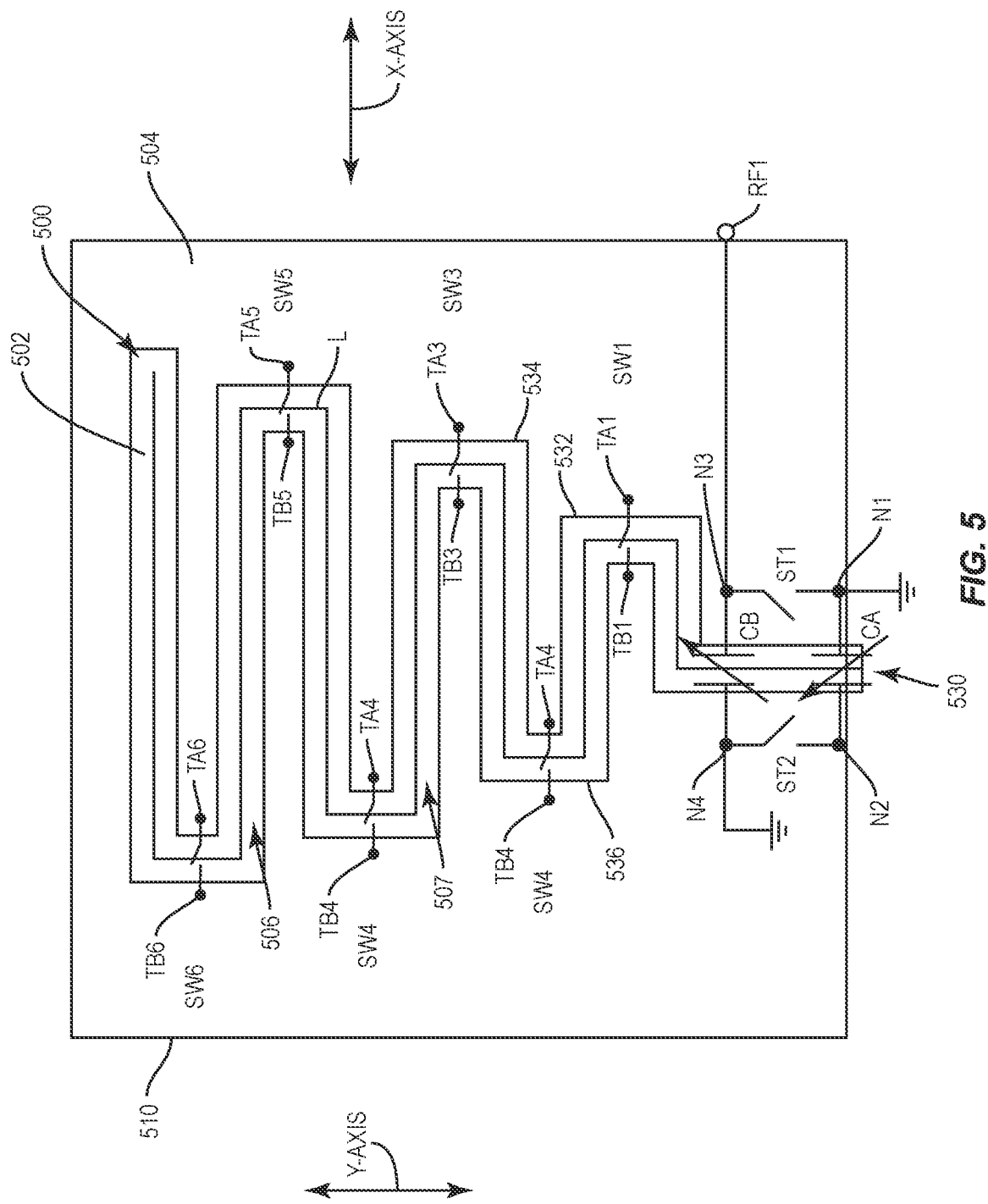
FIG. 5 illustrates an EEVC, in accordance with some embodiments.

FIG. 5 illustrates an EEVC 500, in accordance with some embodiments.

In some embodiments, one or more of the EEVCs 106 in FIG. 1 are provided as the EEVC 500 in FIG. 5. In some embodiments, the EEVC 206 is provided as the EEVC 500 in FIG. 5. In some embodiments, the EEVC 306 in FIG. 3A and FIG. 3B is provided in accordance with the EEVC 500 in FIG. 5. In some embodiments, the EEVC 500 is an EEVA. In some embodiments, the EEVC 500 is an EEVI.

The EEVC 500 is formed on a conductive plane 504. In some embodiments, the conductive plane 504 is the conductive plane 204 in FIG. 2. In some embodiments, the conductive plane 504 is the conductive plane 324 of FIG. 3A and FIG. 3B.

The EEVC 500 is formed by an EEVC void 507 formed in the conductive plane 504. The EEVC void 507 is filled by a substrate 502, in accordance with some embodiments. In some embodiments, the substrate 502 is the substrate 202 of FIG. 2 or the substrate 302 of FIG. 3A and FIG. 3B. An X-axis is defined at the EEVC void 507 along a geometric perimeter 510 of the conductive plane. A Y-axis is defined as aligned with the conductive plane 502 and orthogonal to the X-axis. An opening 530 of the EEVC void 507 is aligned with the geometric perimeter 510 that extends parallel to the X-axis.

In this embodiment, the EEVC void 507 forms a meandering path that alternates between sections that extend parallel to the X-axis and sections that extend parallel to the Y-axis. In this embodiment, the sections of the meandering path that extend parallel to the X-axis get longer the further the sections are from the opening 530. A meandering edge 532 along an EEVC perimeter 534 has sections that extend along the X-axis connected by sections that extend along Y-axis. Another meandering edge 536 has sections that extend along the X-axis connected by sections that extend along Y-axis. The meandering edge 532 faces the meandering edge 536. The meandering path formed by the meandering edges 532, 536 has a length L, which is made from sections parallel to the X-axis and sections parallel to the Y-axis.

Switches SW1-SW6 (referred to collectively and/or generically as switches SW) are provided along the EEVC perimeter 534. Each of the switches SW1-SW6 has a terminal TA1-TA6 (referred to collectively and/or generically as terminal TA) along different locations of the edge 532. Each of the switches SW1-SW6 has a terminal TB1-TB6 (referred to collectively and/or generically as terminal TB) along different locations of the edge 536. With respect to the meandering edge 532 and the meandering edge 536, the location of the terminal TA of each switch SW on the edge 532 is aligned with the location of the terminal TB of the respective switch SW. Accordingly, if none of the switches SW are selected to be in the conducting state, then the length of the current path created by the EEVC 506 is L. However, if one of the switches SW is selected to be in the conducting state while the other switches SW are in the non-conducting state, then the dipole created by the EEVC 506 has a length that is some proportion of the length L (that is less than 1). Thus, by selecting one of the switches SW, the effective length of the current path of the EEVC 500 is selected.

At the opening 530, the first node N1 is connected to the edge 532 and the node N2 is provided. The node N1 is a ground node. A variable capacitive device CA is connected between the node N1 and the node N2. The node N3 is provided. A node N4 is connected to the edge 536 a distance D along the Y-axis from the opening 530. The node N4 is a ground node. A variable capacitive device CB is connected between the node N3 and the node N4. A switch ST1 is connected between the node N1 and N3. A switch ST2 is connected between the node N2 and N4. An RF port RF1 is connected to the node N3. When the switch ST1 is in a conducting state, the RF port RF1 is shorted to ground. As such, the RF port RF1 is not able to receive or transmit RF signals from the antenna (not explicitly show in FIG. 5.) In this case, the EEVC 500 is operating as an EEVI. When the switch ST1 is in a conducting state and the switch ST2 is in a nonconducting state, then only the capacitive device CB is provided in the circuitry of the EEVI. In some embodiments, the EEVI is being tuned in a high frequency band. When the switch ST1 is in a conducting state and the switch ST2 is in a conducting state, the capacitive device CA and the capacitive device CB are presenting a capacitance to the EEVI. In this example, the EEVI is being tuned in a low frequency band.

When the switch ST1 is in a nonconducting state, the RF port RF1 has a non-shorted path to the EEVC 500. As such, the RF port RF1 is able to receive or transmit RF signals from the antenna (not explicitly show in FIG. 5). In this case, the EEVC 500 is operating as an EEVA. When the switch ST1 is in a nonconducting state and the switch ST2 is in a nonconducting state, then only the capacitive device CB is provided in the circuitry of the EEVA. In some embodiments, the EEVA is being tuned in a high frequency band. When the switch ST1 is in a nonconducting state and the switch ST2 is in a conducting state, the capacitive device CA and the capacitive device CB are presenting a capacitance to the EEVA. In this example, the EEVA is being tuned in a low frequency band. By varying a variable capacitance of the variable capacitive device CA and/or the variable capacitance of the variable capacitive device CB, a frequency band of the EEVC 500 can be tuned.

Figure 6:
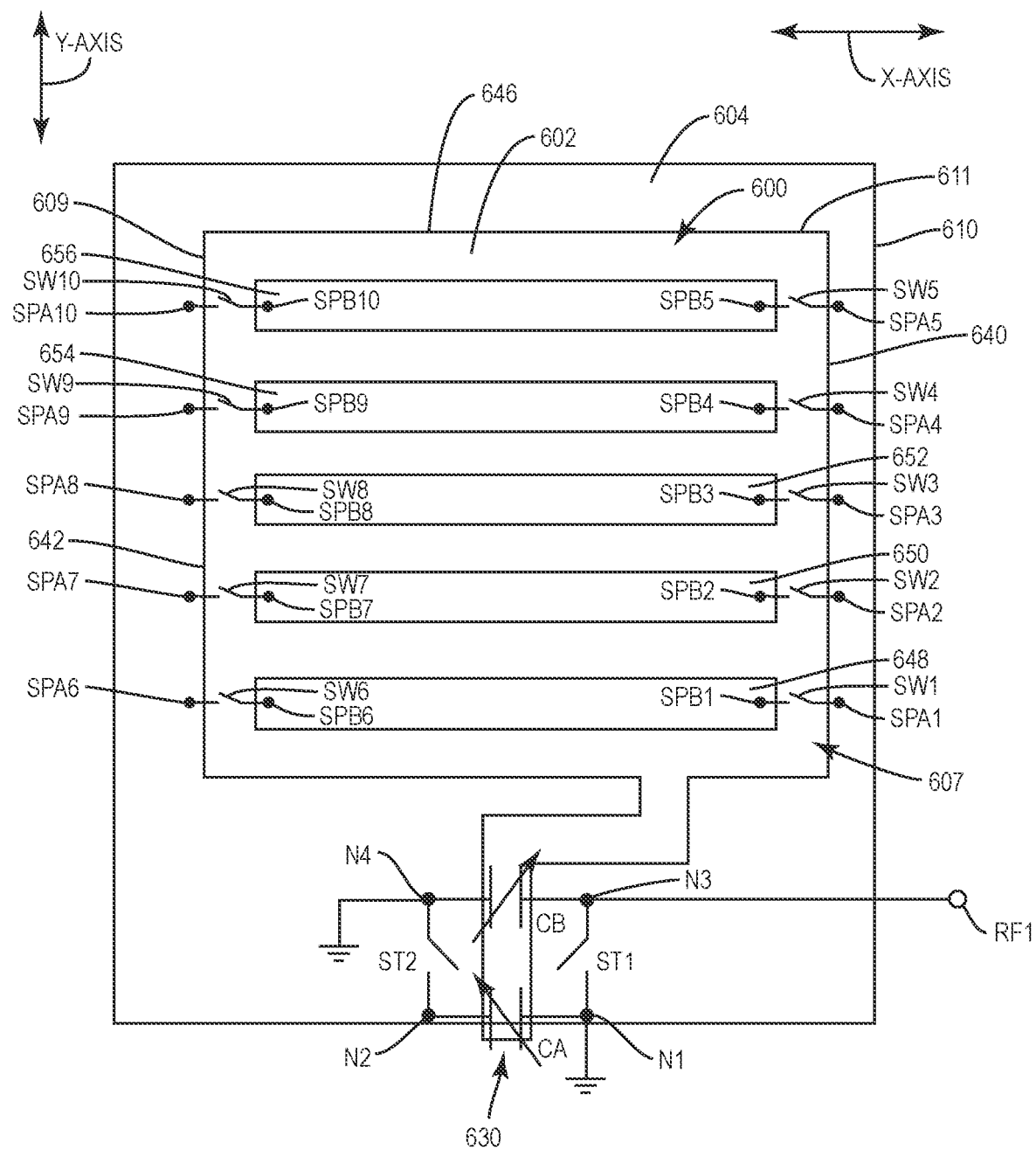
FIG. 6 is an EEVC, in accordance with some embodiments.

FIG. 6 is an EEVC 600, in accordance with some embodiments.

In some embodiments, one or more of the EEVCs 106 in FIG. 1 are provided as the EEVC 600 in FIG. 5. In some embodiments, the EEVC 206 is provided as the EEVC 600 in FIG. 5. In some embodiments, the EEVC 306 in FIG. 3A and FIG. 3B is provided in accordance with the EEVC 600 in FIG. 5. In some embodiments, the EEVC 600 is an EEVA. In some embodiments, the EEVC 600 is an EEVI.

The EEVC 600 is formed on a conductive plane 604. In some embodiments, the conductive plane 604 is the conductive plane 204 in FIG. 2. In some embodiments, the conductive plane 604 is the conductive plane 324 of FIG. 3A and FIG. 3B.

The EEVC 600 is formed by an EEVC void 607 formed in the conductive plane 602. The EEVC void 607 is filled by a substrate 602, in accordance with some embodiments. In some embodiments, the substrate 602 is the substrate 202 of FIG. 2 or the substrate 302 of FIG. 3A and FIG. 3B. An X-axis is defined at the EEVC void 607 along a geometric perimeter 610 of the conductive plane. A Y-axis is defined as aligned with the conductive plane 602 and orthogonal to the X-axis. An opening 630 of the EEVC void 607 is aligned with the geometric perimeter 610 that extends parallel to the X-axis.

In this embodiment, the EEVC void 607 defines an EEVC perimeter 609 defining an exterior edge 611. The exterior edge 611 defines a first side 640 and a second side 642. The first side 640 faces the second side 642 and are parallel to the X-axis. The exterior side 611 further defines a third side 644 and a fourth side 646, which are each parallel to the Y-axis. The third side 644 faces the fourth side 646. The ends of the first side 640 and the second side 642 connect to the ends to third side 644 and the fourth side 646.

Conductive islands 648. 650, 652, 654, 656 provided between the first side 640 and the second side 642 of the exterior edge 611. In this embodiment, each of the conductive islands 648. 650, 652, 654, 656 is rectangular. In other embodiments, the conductive islands 648. 650, 652, 654, 656 are any suitable shape. For each of the conductive islands 648. 650, 652, 654, 656 an island perimeter 658, 660, 662, 664, 666 of the conductive islands 648. 650, 652, 654, 656 is part of the EEVC perimeter 609.

The EEVC 600 includes switches SW1-SW10. With regard to switches SW1-SW5, each of the switches SW1-SW5 includes a switch port SPA1-SPA5 at a different location of the first side 640. Additionally, a switch port SPB1 of the switch SW1 is connected at a side of the conductive island 648. A switch port SPB2 of the switch SW2 is connected at an side of the conductive island 650. A switch port SPB3 of the switch SW3 is connected at an side of the conductive island 652. A switch port SPB4 of the switch SW4 is connected at a side of the conductive island 654. A switch port SPB5 of the switch SW5 is connected at an side of the conductive island 656.

With regard to switches SW6-SW10, each of the switches SW6-SW10 includes a switch port SPA6-SPA10 at a different location of the second side 642. Additionally, a switch port SPB6 of the switch SW6 is connected at another side of the conductive island 648. A switch port SPB7 of the switch SW7 is connected at another side of the conductive island 650. A switch port SPB8 of the switch SW8 is connected at another side of the conductive island 652. A switch port SPB9 of the switch SW9 is connected at another side of the conductive island 654. A switch port SPB10 of the switch SW10 is connected at another side of the conductive island 656.

Each of the switches SW1-SW10 is configured to be provided in a conducting state and a non-conducting state. One of the switches SW1-SW5 and one of the switches SW6-SW10 are selected to be in the conducting state to determine the frequency band of the EEVC 600.

If the pair of switches (SW1-SW5) (SW6-SW10) placed in the conductive state are at different and opposite sides of the same conductive island 648, 650, 652, 654, 656, then the effective length of the current path provided by EEVC 600 is being selected. For example, both the switch SW1 and the switch SW6 are at opposite sides of the conductive island 648. Accordingly, if both the switch SW1 and the switch SW6 are selected to be in the conducting state then the effective length of the current path provided by EEVC 600 is provided in accordance with the position of the conductive island 648 relative to the Y-axis. The frequency band of the EEVC 600 is determined by this effective length.

If the pair of switches (SW1-SW5) (SW6-SW10) placed in the conductive state are at different and opposite sides of different conductive islands 648, 650, 652, 654, 656, then a subset of the conductive island provide a transmission line. For example, the switch SW1 and the switch SW8 are at opposite sides of the conductive island 648 and the conductive island 652. The conductive island 650 is between the conductive island 648 and the conductive island 652. Thus, the conducive islands 648, 650, 652 form transmission lines. Accordingly, the frequency band of the EEVC 600 is determined by the electromagnetic characteristics of the electromagnetically coupled conducive islands 648, 650, 652.

At the opening 630, a first node N1 is connected to the edge 632 and a node N2 is provided. The node N1 is a ground node. A variable capacitive device CA is connected between the node N1 and the node N2. A node N3 is provided. A node N4 is connected to the edge 636 a distance D along the Y-axis from the opening 630. The node N4 is a ground node. A variable capacitive device CB is connected between the node N3 and the node N4. A switch ST1 is connected between the node N1 and N3. A switch ST2 is connected between a node N2 and N4. The RF port RF1 is connected to the node N3.

When the switch ST1 is in a conducting state, the RF port RF1 is shorted to ground. As such, the RF port RF1 is not able to receive or transmit RF signals from the antenna (not explicitly show in FIG. 5.) In this case, the EEVC 500 is operating as an EEVI. When the switch ST1 is in a conducting state and the switch ST2 is in a nonconducting state, then only the capacitive device CB is provided in the circuitry of the EEVI. In some embodiments, the EEVI is being tuned in a high frequency band. When the switch ST1 is in a conducting state and the switch ST2 is in a conducting state, the capacitive device CA and the capacitive device CB are presenting a capacitance to the EEVI. In this example, the EEVI is being tuned in a low frequency band.

When the switch ST1 is in a nonconducting state, the RF port RF1 has a non-shorted path to the EEVC 600. As such, the RF port RF1 is able to receive or transmit RF signals from the antenna (not explicitly show in FIG. 5). In this case, the EEVC 600 is operating as an EEVA. When the switch ST1 is in a nonconducting state and the switch ST2 is in a nonconducting state, then only the capacitive device CB is provided in the circuitry of the EEVA. In some embodiments, the EEVA is being tuned in a high frequency band. When the switch ST1 is in a nonconducting state and the switch ST2 is in a conducting state, the capacitive device CA and the capacitive device CB are presenting a capacitance to the EEVA. In this example, the EEVA is being tuned in a low frequency band. By varying a variable capacitance of the variable capacitive device CA and/or the variable capacitance of the variable capacitive device CB, a frequency band of the EEVC 600 can be tuned.

Figure 7:
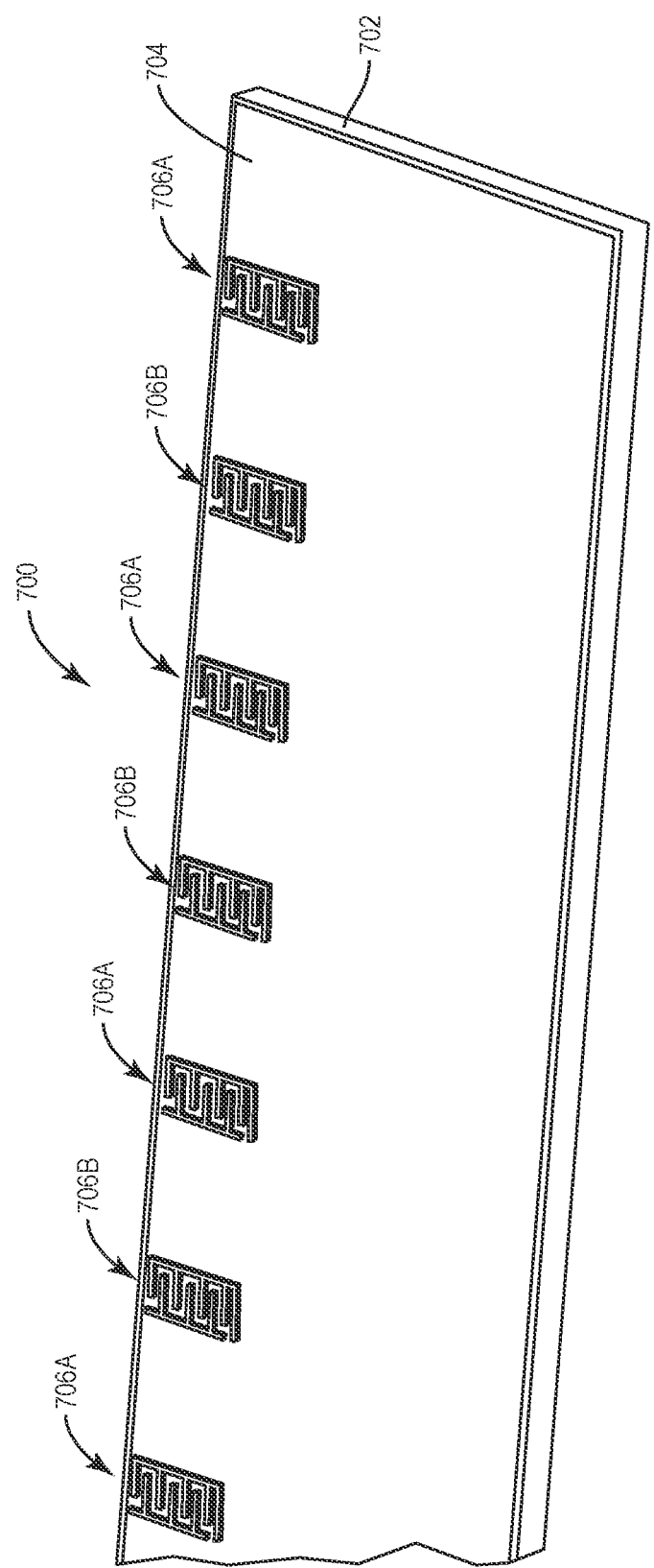
FIG. 7 is an embodiment of a printed circuit board, in accordance with some embodiments.

FIG. 7 is an embodiment of a printed circuit board 700, in accordance with some embodiments.

The printed circuit board 700 includes a substrate 702 and a conductive plane 704 formed on the substrate 702. In this embodiment, the conductive plane 704 is a ground plate. The printed circuit board 700 includes an array of EEVA 706A and EEVIs 706B (referred to generically or collectively as EEVCs 706).

Between each of the EEVAs 706A the EEVI 706B is provided. The EEVIs 706B are provided to provide isolation between the EEVA 706A. In this manner, the EEVAs 706A can be placed close to one another with little to no interference. In this embodiment, the EEVCs 706 are provided in module form, such as the EEVC 300 shown in FIG. 3A and FIG. 3B. However, in other embodiments, the EEVCs 706 are formed within the conductive plane 704 itself, such as the EEVC 200 in FIG. 2.

In some embodiments, one or more of the EEVCs 706 are provided as the EEVC 400 shown in FIG. 4. In some embodiments, one or more of the EEVCs 706 are provided as the EEVC 500 shown in FIG. 5. In some embodiments, one or more of the EEVCs 706 are provided as the EEVC 600 shown in FIG. 6.

Figure 8:
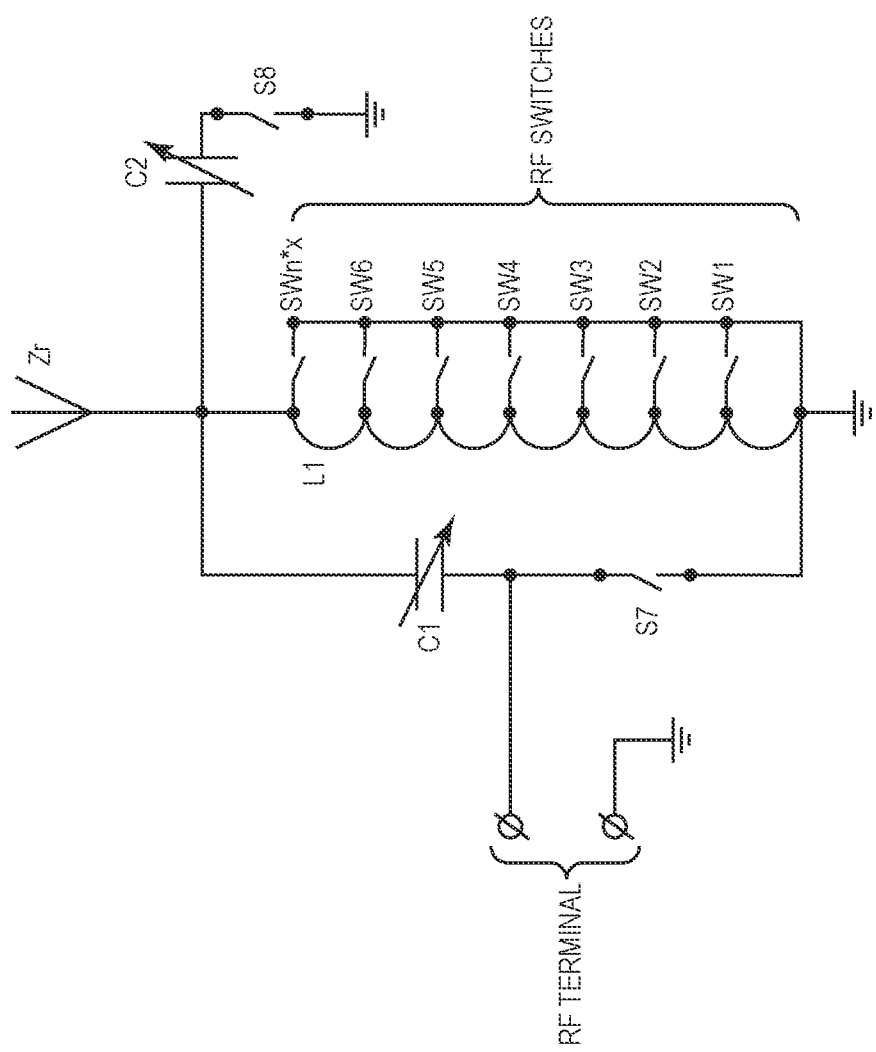
FIG. 8 illustrates front end antenna circuitry, in accordance with some embodiments.

FIG. 8 illustrates front end antenna circuitry 800, in accordance with some embodiments.

The front-end antenna circuitry 800 includes an EEVC 802, which is represented by an antenna 804 and an inductor L1. The EEVC 802 includes switches SW1-SWn (referred to generically and/or collectively as switches SW), where n is an integer greater than or equal to 2. As in the EEVCs discussed above, the switches SW are selectable to determine an inductance value of the EEVC 802 and thereby the frequency band of the front end antenna circuitry 800.

The front end antenna circuitry 800 further includes an RF port 806 and a variable capacitive device C1 connected between a node NRF1 and a node NRF2 at the EEVC 802. A switch S7 is connected between the node NRF1 and ground. When the switch S7 is in a non-conducting state, the EEVC 802 operates as an EEVA. When the switch S7 is in a conducting state, the node NRF1 is shorted and the EEVC 802 operates as an EEVI. Another variable capacitive device C2 is connected between the node NRF2 and a node NRF3.

The node NRF3 is a switch port of a switch S8. The other switch port NRF4 of the switch S8 is connected to ground. In some embodiments, the switch S8 operates as a small capacitor to provide a small capacitance value.

In some embodiments, the EEVC 802 is provided as the EEVC 200 in FIG. 2. In some embodiments, the EEVC 802 is provided as the EEVC 306 in FIG. 3. In some embodiments, the EEVC 802 is provided as the EEVC 400 in FIG. 4. In some embodiments, the EEVC 802 is provided as the EEVC 500 in FIG. 5. In some embodiments, the EEVC 802 is provided as the EEVC 600 in FIG. 6.

Figure 9:
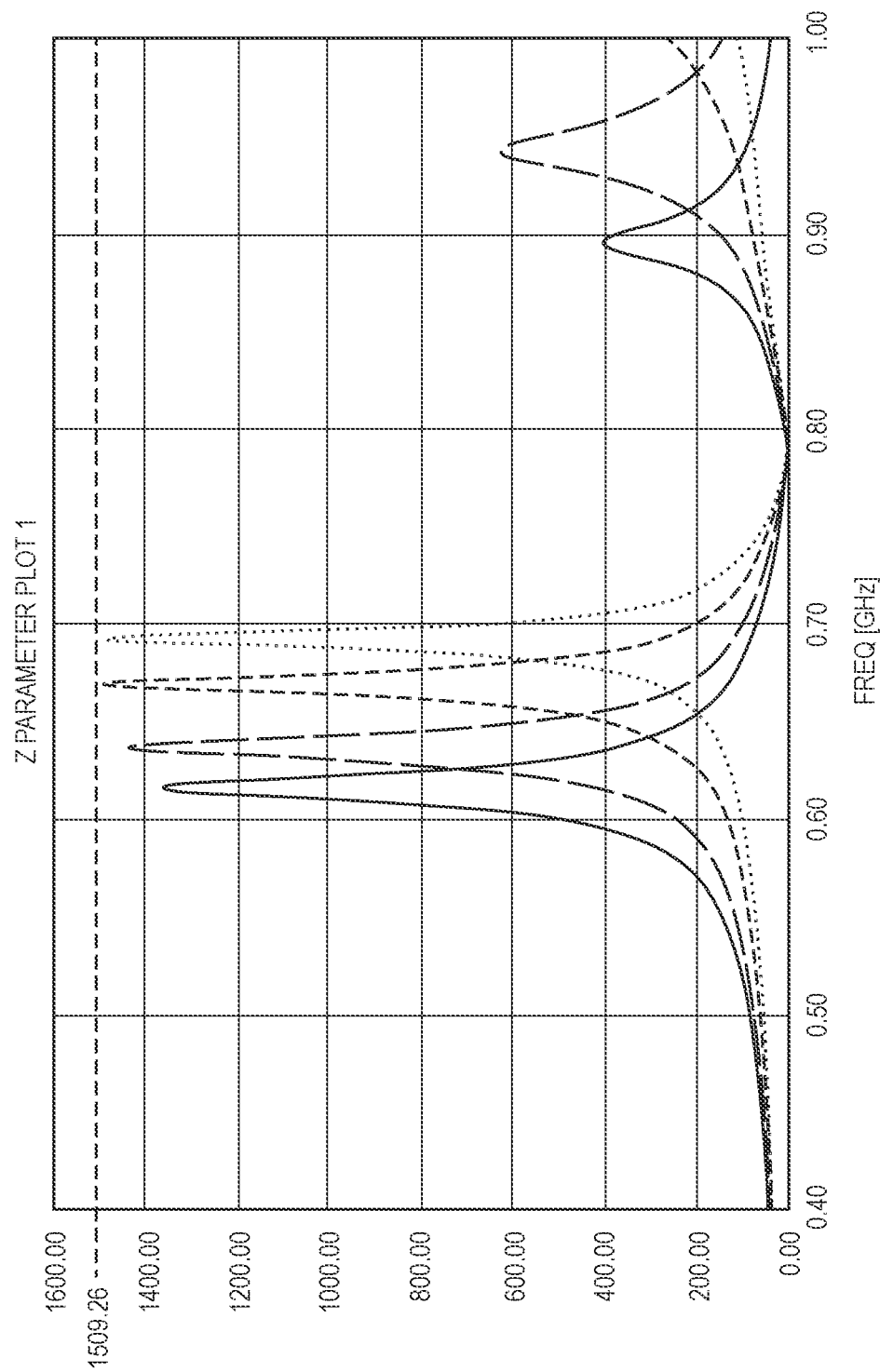
FIG. 9 illustrates Z-parameter of a frequency response of the EEVC of the FIG. 8 when the EEVC is operating as an edge enable void antenna (EEVA), in accordance with some embodiments.

FIG. 9 illustrates Z-parameter of a frequency response 900 of the EEVC 800 of the FIG. 8 when the EEVC 800 is operating as an EEVA, in accordance with some embodiments.

The frequency response 900 includes a passband that is set to different frequency bands by tuning the front end antenna circuitry 800. The frequency response 900 is set to different frequency bands by selecting which of the switches SW1-SWn to place in the conducting state and by adjusting the variable capacitance of the variable capacitance devices C1, C2.

Figure 10:
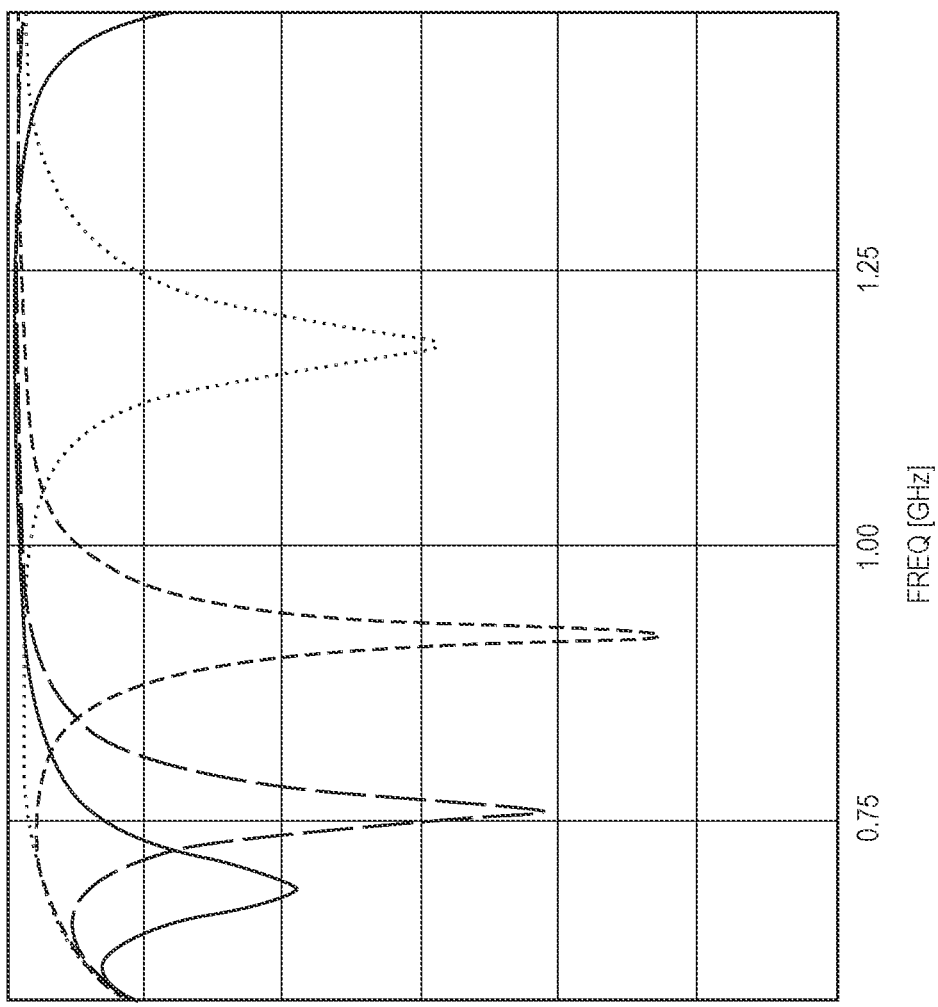
FIG. 10 illustrates S-parameter of a frequency response of the EEVC of the FIG. 8 when the EEVC is operating as an edge enable void isolator (EEVI), in accordance with some embodiments.

FIG. 10 illustrates S-parameter of a frequency response 1000 of the EEVC 800 of the FIG. 8 when the EEVC 800 is operating as an EEVI, in accordance with some embodiments.

The frequency response 1000 includes a stopband that is set to different frequency bands by tuning the front end antenna circuitry 800. The frequency response 1000 is set to different frequency bands by selecting which of the switches SW1-SWn to place in the conducting state and by adjusting the variable capacitance of the variable capacitance devices C1, C2.

What is claimed is:

1. A printed circuit board, comprising:
    a substrate;
    a conductive plane comprising an edge enabled void construction (EEVC) along a geometric perimeter of the conductive plane, the EEVC having an EEVC void that defines an EEVC perimeter that extends into the conductive plane, wherein the EEVC void causes a phase change in current flow caused by a skin effect within the conductive plane;
    an operating mode switching arrangement operable to cause the EEVC to selectively switch between an edge enabled void antenna, EEVA, mode of operation and an edge enabled void isolator, EEVI, mode of operation; and
    a switch having a first switch port and a second switch port such that the switch is operable to be in a conducting state and a nonconducting state with respect to the first switch port and the second switch port, the first switch port being coupled to a first location of the EEVC perimeter and the second switch port being coupled to a second location of the EEVC perimeter.

2. The printed circuit board of claim 1, wherein a portion of the substrate fills the EEVC void.

3. The printed circuit board of claim 1, wherein the conductive plane is a ground plate for the printed circuit board.

4. The printed circuit board of claim 1, further comprising a ground plate for the printed circuit board, wherein:
    the ground plate defines a ground plate void;
    the conductive plane is inserted into the ground plate void.

5. The printed circuit board of claim 1, wherein the EEVC void defines a meandering path such that the EEVC perimeter defines a first edge and a second edge such that the first edge faces the second edge, wherein the first location is on the first edge and the second location is on the second edge.

6. The printed circuit board of claim 1, further comprising:
    the EEVC perimeter defining an exterior edge such that the exterior edge defines a first side and a second side, wherein the first side faces the second side.

7. The printed circuit board of claim 6, further comprising a second switch, wherein:
    the switch is a first switch;
    the island perimeter defines a first island side and a second island side:
        the first location is at the first island side;
        the second switch having a third switch port and a fourth switch port such that the second switch is operable to be in the conducting state and the nonconducting state with respect to the third switch port and the fourth switch port.

8. The printed circuit board of claim 7, wherein the third switch port is coupled to the second island side and the fourth switch port is connected to the second side of the exterior edge.

9. The printed circuit board of claim 6, further comprising a conductive island provided between the first side and the second side of the exterior edge such that an island perimeter of the conductive island is part of the EEVC perimeter.

10. The printed circuit board of claim 9, further comprising a second conductive island, wherein:
    the conductive island is a first conductive island;
    the second conductive island is provided between the first side and the second side of the exterior edge such that the island perimeter of the second conductive island is part of the EEVC perimeter.

11. The printed circuit board of claim 10, further comprising a third switch port that is coupled to the island perimeter of the second conductive island and a fourth switch port that is connected to the second side of the exterior edge.

12. The printed circuit board of claim 9, wherein the first location of the EEVC perimeter is on the first side of the exterior edge and the second location of the EEVC perimeter is on the island perimeter.

* * * * *